(12) United States Patent
Kazama

(10) Patent No.: US 8,963,172 B2
(45) Date of Patent: Feb. 24, 2015

(54) OPTICAL SEMICONDUCTOR DEVICE INCLUDING ANTIPARALLEL SEMICONDUCTOR LIGHT-EMITTING ELEMENT AND SCHOTTKY DIODE ELEMENT

(71) Applicant: Stanley Electric Co., Ltd., Meguro-ku, Tokyo (JP)

(72) Inventor: Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/194,071

(22) Filed: Feb. 28, 2014

(65) Prior Publication Data

US 2014/0246686 A1 Sep. 4, 2014

(30) Foreign Application Priority Data

Mar. 1, 2013 (JP) ................. 2013-040488

(51) Int. Cl.
*H01L 29/18* (2006.01)
*H01L 25/16* (2006.01)
*H01L 25/075* (2006.01)

(52) U.S. Cl.
CPC ........... *H01L 25/167* (2013.01); *H01L 25/0753* (2013.01)
USPC ....................................................... 257/88

(58) Field of Classification Search
CPC . H01L 33/0004; H01L 33/0033; H01L 33/06; H01L 33/18; H01L 33/285; H01L 33/36; H01L 33/387

USPC ................................................... 257/88–100
See application file for complete search history.

(56) References Cited

U.S. PATENT DOCUMENTS

| | | | |
|---|---|---|---|
| 2008/0211421 A1* | 9/2008 | Lee et al. | 315/250 |
| 2011/0074305 A1* | 3/2011 | Yeh et al. | 315/253 |
| 2011/0272728 A1 | 11/2011 | Rode et al. | |

FOREIGN PATENT DOCUMENTS

JP 2011-520270 A 7/2011

* cited by examiner

*Primary Examiner* — Brook Kebede
(74) *Attorney, Agent, or Firm* — Holtz, Holtz, Goodman & Chick PC

(57) ABSTRACT

An optical semiconductor device includes a semiconductor support substrate of a conductivity type having a first resistivity, a semiconductor layer of the conductivity type formed on the semiconductor support substrate and having a second resistivity higher than the first resistivity, a first power supply terminal having a first metal in Schottky barrier contact with the semiconductor layer along with the semiconductor support substrate, so that a Schottky diode element is constructed by the first power supply terminal and the semiconductor layer along with the semiconductor support substrate, a second power supply terminal having a second metal in ohmic contact with the semiconductor support substrate, and a semiconductor light-emitting element connected between the first and second power supply terminals, the semiconductor light-emitting element being antiparallel with the Schottky diode with respect to the first and second power supply terminals.

8 Claims, 9 Drawing Sheets

OPTICAL SEMICONDUCTOR DEVICE INCLUDING ANTIPARALLEL SEMICONDUCTOR LIGHT-EMITTING ELEMENT AND SCHOTTKY DIODE ELEMENT

This application claims the priority benefit under 35 U.S.C. §119 to Japanese Patent Application No. JP2013-040488 filed on Mar. 1, 2013, which disclosure is hereby incorporated in its entirety by reference.

BACKGROUND

1. Field

The presently disclosed subject matter relates to an optical semiconductor device including a semiconductor light-emitting element and a Schottky diode element as an electrostatic protection element which are antiparallelly-connected to each other.

2. Description of the Related Art

Generally, in an optical semiconductor device including a semiconductor light-emitting element such as a light-emitting diode (LED) element or a laser diode (LD) element, an electrostatic discharge (ESD) protection circuit is connected between the terminals of the semiconductor light-emitting element, in order to avoid damage or destruction by ESD phenomena. Particularly, the reverse breakdown voltage of a GaN light-emitting element by applying a reverse voltage thereto is smaller than those of AlGaAs, AlGaInP or GaP light-emitting elements by applying reverse voltages thereto. Therefore, GaN light-emitting elements are easily subject to damage or destruction due to the application of a small reverse voltage thereto.

In a first prior art optical semiconductor device, a semiconductor light-emitting element and a Zener diode element as an ESD protection element are antiparallelly connected to each other, and also, are mounted on a semiconductor support substrate.

When a reverse voltage due to the ESD phenomena is applied to the first prior art optical semiconductor device, a forward current flows through the Zener diode element, so that the above-mentioned reverse voltage is not applied to the semiconductor light-emitting element. Thus, the reverse breakdown voltage of the semiconductor light-emitting element against the ESD phenomena can substantially be increased.

In the above-described first prior art optical semiconductor device, however, the mounting steps of the Zener diode element are so complex that the manufacturing cost would be increased. Also, spacing for mounting the Zener diode element is required in the semiconductor support substrate, which would increase the device in size.

In a second prior art optical semiconductor device (see: JP2011-520270 & US2011/0272728A1), a semiconductor light-emitting element is mounted on a semiconductor support substrate, and a Schottky diode element as an ESD protection element is formed in the semiconductor support substrate. Also, in this case, the semiconductor light-emitting element and the Schottky diode element are antiparallel with each other.

When a reverse voltage due to the ESD phenomena is applied to the second prior art optical semiconductor device, a forward current flows through the Schottky diode element, so that the above-mentioned reverse voltage is not applied to the semiconductor light-emitting element. Thus, the reverse breakdown voltage of the semiconductor light-emitting element against the ESD phenomena can substantially be increased.

In the above-described second prior art optical semiconductor device, since the semiconductor support substrate is connected directly to the semiconductor light-emitting element, the resistivity of the semiconductor support substrate is made low in order to suppress the forward voltage drop of the semiconductor light-emitting element.

Note that, if the resistivity of the semiconductor support substrate is high, the forward voltage drop of the semiconductor light-emitting element is increased to increase the power loss and the generated heat, which would not realize a high-power semiconductor light-emitting element.

In the above-described second prior art optical semiconductor device, however, since the resistivity of the semiconductor support substrate is low, the reverse breakdown voltage of the Schottky diode element formed by the semiconductor support substrate is decreased. Therefore, if a semiconductor light-emitting element is constructed by a GaN LED element or a series of other LED elements to have a higher forward voltage, the forward voltage drop of the semiconductor light-emitting element becomes smaller than the reverse breakdown voltage of the Schottky diode element. As a result, a current, which should naturally be supplied to the semiconductor light-emitting element, would be leaked to the Schottky diode element, thus decreasing its luminous intensity.

SUMMARY

The presently disclosed subject matter seeks to solve one or more of the above-described problems.

According to the presently disclosed subject matter, an optical semiconductor device includes a semiconductor support substrate of a conductivity type having a first resistivity, a semiconductor layer of the conductivity type formed on the semiconductor support substrate and having a second resistivity higher than the first resistivity, a first power supply terminal having a first metal in Schottky barrier contact with the semiconductor layer along with the semiconductor support substrate, so that a Schottky diode element is constructed by the first power supply terminal and the semiconductor layer along with the semiconductor support substrate, a second power supply terminal having a second metal in ohmic contact with the semiconductor support substrate, and a semiconductor light-emitting element connected between the first and second power supply terminals, the semiconductor light-emitting element being antiparallel with the Schottky diode with respect to the first and second power supply terminals.

According to the presently disclosed subject matter, the reverse breakdown voltage of the Schottky diode element can be made larger than the forward voltage drop of the semiconductor light-emitting element. Therefore, when a forward current is supplied to the semiconductor light-emitting element, such a forward current can be prevented from flowing through the Schottky diode element, thus suppressing the reduction of the luminous intensity of the semiconductor light-emitting element.

BRIEF DESCRIPTION OF THE DRAWINGS

The above and other advantages and features of the presently disclosed subject matter will be more apparent from the following description of certain embodiments, taken in conjunction with the accompanying drawings, wherein.

DETAILED DESCRIPTION OF EXEMPLARY EMBODIMENTS

Figure 1:
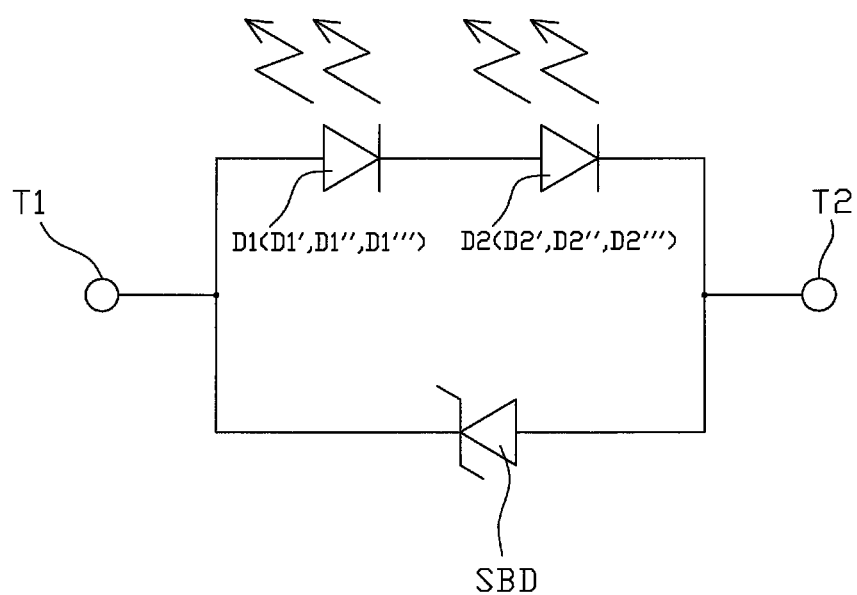
FIG. 1 is an equivalent circuit diagram of an optical semiconductor device to which the presently disclosed subject matter is applied.

In FIG. 1, which is an equivalent circuit diagram of an optical semiconductor device to which the presently disclosed subject matter is applied, a series of two LED elements D1 (D1', D1", D1''') and D2 (D2', D2", D2''') are connected between a positive potential power supply terminal T1 and a ground potential power supply terminal T2, and also, a Schottky diode element SBD are antiparallel with the LED elements D1 (D1', D1", D1''') and D2 (D2', D2", D2''') with respect to the power supply terminals T1 and T2. As a result, when a reverse voltage due to the ESD phenomena is applied to the optical semiconductor device of FIG. 1, a forward current flows through the Schottky diode element SBD, so that the above-mentioned reverse voltage is not applied to the LED elements D1 (D1', D1", D1''') and D2 (D2', D2", D2'''). Thus, the reverse breakdown voltage of the LED elements D1 (D1', D1", D1''') and D2 (D2', D2", D2''') against the ESD phenomena can substantially be increased.

In FIG. 1, the reverse breakdown voltage of the Schottky diode element SBD is made larger than the forward voltage drop of the LED elements D1 and D2. As a result, a current, which should naturally be supplied to the LED elements D1 and D2, would not be leaked to the Schottky diode element SBD, thus increasing the luminous intensity.

Figure 2:
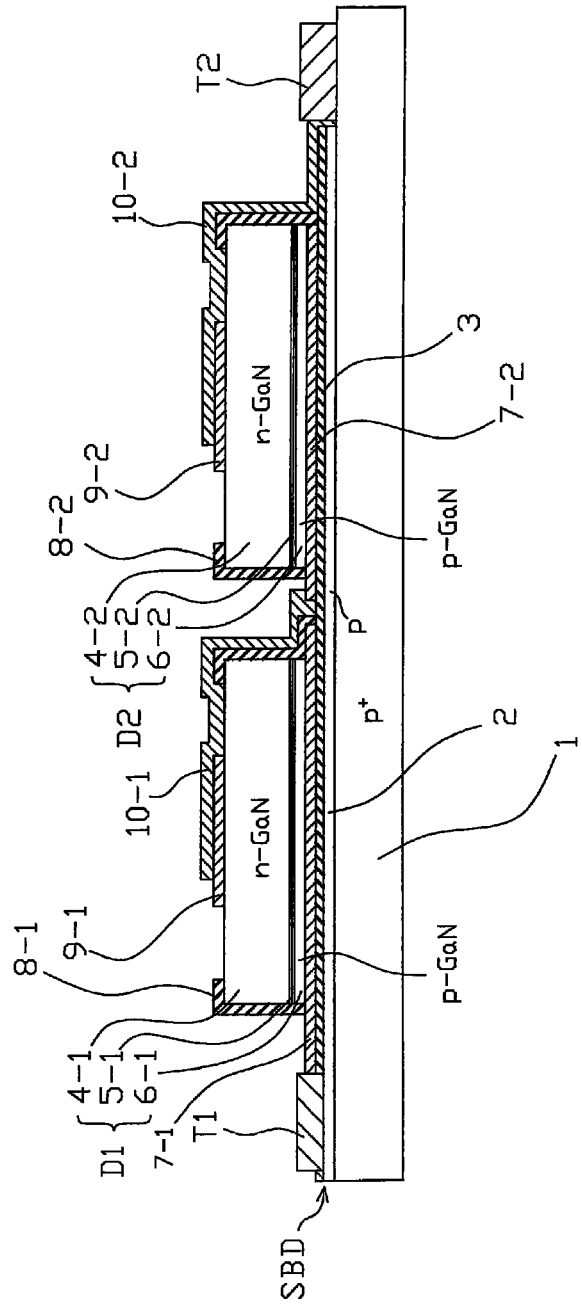
FIG. 2 is a cross-sectional view illustrating a first embodiment of the optical semiconductor device according to the presently disclosed subject matter.

In FIG. 2, which is a cross-sectional view illustrating a first embodiment of the optical semiconductor device according to the presently disclosed subject matter, the LED elements D1 and D2 of a non-via-type are arranged side by side.

In FIG. 2, provided on a 50 μm or more thick p$^+$-type monocrystalline silicon support substrate 1 is an about 0.1 to 10.0 μm thick p-type silicon layer 2. For example, the p$^+$-type monocrystalline silicon support substrate 1 has a boron concentration of $1 \times 10^{17}$ cm$^{-3}$ or more, preferably, $2 \times 10^{18}$ cm$^{-3}$ or more, exhibiting a low resistivity of 0.05Ω·cm or less. Also, the p-type silicon layer 2 has a boron concentration of $1 \times 10^{17}$ cm$^{-3}$ or less, preferably, $2 \times 10^{16}$ cm$^{-3}$ or less, exhibiting a high resistivity of 1Ω·cm or more. Further, an insulating layer 3 made of silicon dioxide, silicon nitride or the like is formed on the p-type silicon layer 2.

Also, the LED element D1 formed by an n-type GaN layer 4-1, an InGaN/GaN multiple quantum well (MQW) active layer 5-1 and a p-type GaN layer 6-1 is bonded by a bonding layer 7-1 on the insulating layer 3, and the LED element D2 formed by an n-type GaN layer 4-2, an InGaN/GaN MQW active layer 5-2 and a p-type GaN layer 6-2 is bonded by a bonding layer 7-2 on the insulating layer 3. Note that the active layers 5-1 and 5-2 can be made of a single quantum well (SQW) structure or a single layer. The LED elements D1 and D2 are connected in series between the terminals T1 and T2.

Further, protection layers 8-1 and 8-2 made of silicon dioxide or the like are provided for electrically protecting the LED elements D1 and D2. In addition, n-side electrodes 9-1 and 9-2 are provided on the LED elements D1 and D2, respectively. Still, a connection layer 10-1 is connected between the n-side electrode 9-1 and the bonding layer 7-2, and a connection layer 10-2 is connected between the n-side electrode 9-2 and the power supply terminal T2.

Figure 3:
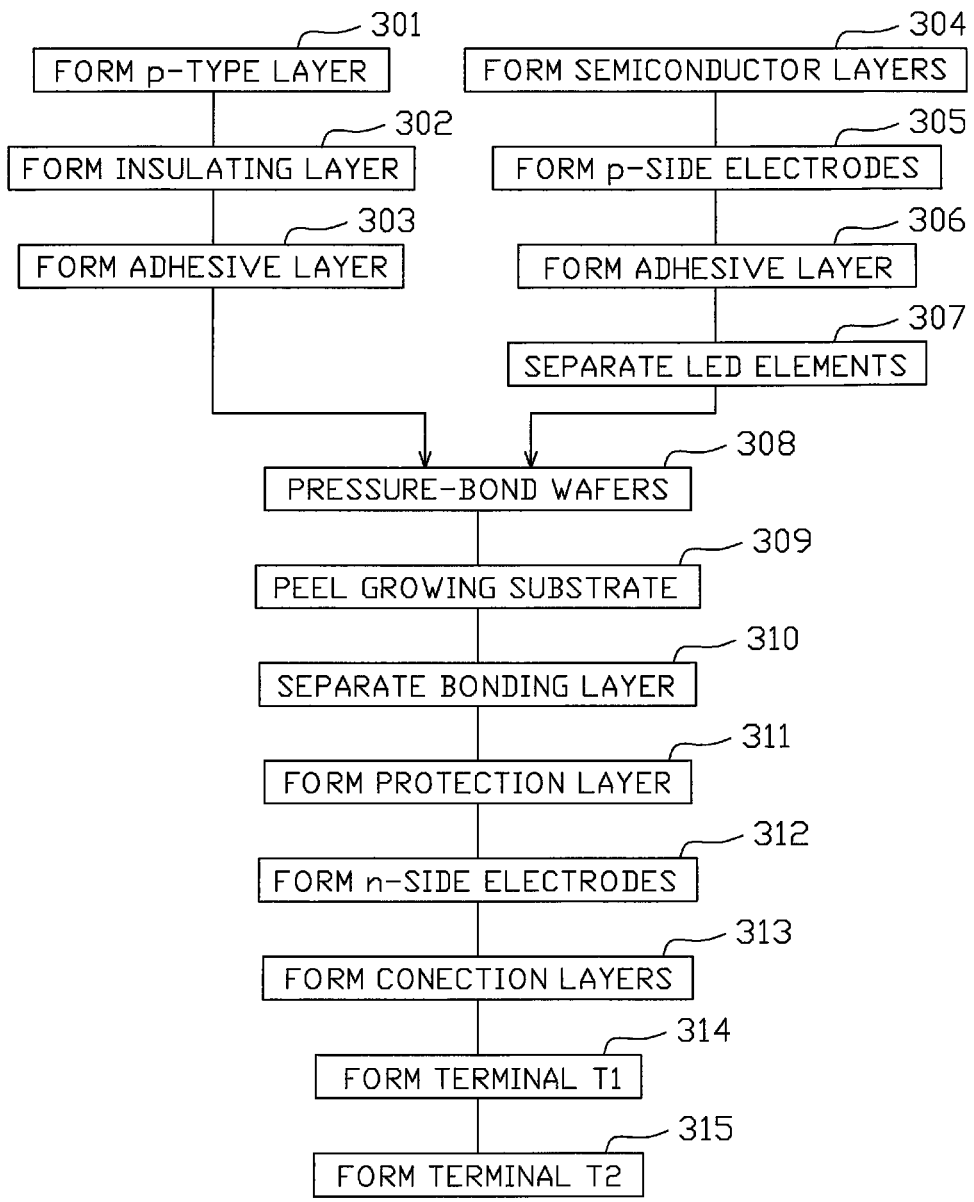
FIG. 3 is a flowchart for explaining a method for manufacturing the optical semiconductor device of FIG. 2.

A method for manufacturing the optical semiconductor device of FIG. 2 is explained next with reference to a flowchart as illustrated in FIG. 3.

First, referring to step 301, a p-type silicon layer 2 is grown by an epitaxial process on a p$^+$-type monocrystalline silicon support substrate 1.

Next, referring to step 302, an insulating layer 3 is formed by a chemical vapor deposition (CVD) process on the p-type silicon layer 2.

Next, referring to step 303, an about 1 μm thick adhesive layer (not shown) is deposited by a resistance heating evaporation process on the insulating layer 3. Note that this adhesive layer is used in a wafer pressure-bonding process which will be explained later.

On the other hand, referring to step 304, semiconductor layers, i.e., an about 5 μm thick n-type GaN layer, an InGaN/GaN MQW active layer and an about 0.5 μm thick p-type GaN layer are sequentially and epitaxially grown by a metal organic chemical vapor deposition (MOCVD) process on a semiconductor growing sapphire substrate (not shown).

Next, referring to step 305, p-side electrodes (not shown) made of about 200 nm thick AgTiWPtAu are formed by an electron beam (EB) evaporation/photolithography process on p-type GaN layer.

Next, referring to step 306, an about 200 nm thick adhesive layer (not shown) is deposited by a resistance heating evaporation process on the p-type GaN layer. Note that this adhesive layer is used in the wafer pressure-bonding process which will be later explained.

Next, referring to step 307, the n-type GaN layer, the active layer and the p-type GaN layer are patterned by a dry etching using chlorine gas to obtain the n-type GaN layer 4-1, the active layer 5-1 and the p-type GaN layer 6-1 for the LED element D1 and the n-type GaN layer 4-2, the active layer 5-2 and the p-type GaN layer 6-2 for the LED element D2. In this case, the LED elements D1 and D2 are combined by the adhesive layer deposited by step 306.

Next, referring to step 308, the LED elements D1 and D2 combined by the adhesive layer (not shown) are placed face down and bonded by a wafer pressure-bonding process onto the insulating layer 3 along with the adhesive layer (not shown) on the side of the p$^+$-type monocrystalline silicon support substrate 1. The wafer pressure-bonding process is carried out at a temperature of about 300° C. at a pressure of about 3 MPa for about 10 minutes. Thus, the adhesive layer on the side of the LED elements D1 and D2 and the adhesive layer on the side of the p$^+$-type monocrystalline silicon support substrate 1 are melted to form one bonding layer which will be separated into bonding layers 7-1 and 7-2.

Next, referring to step 309, the semiconductor growing sapphire substrate (not shown) for absorbing a visible light component is wholly peeled from the n-type GaN layers 4-1 and 4-2 by a laser lift-off process using an ultraviolet (UV) excimer laser to melt the interface portion of the n-type GaN layers 4-1 and 4-2 near the semiconductor growing sapphire substrate (not shown).

Next, referring to step 310, the bonding layer is partly removed by a photolithography/dry etching process using Ar gas so that the bonding layer is divided into bonding layers 7-1 and 7-2. As a result, the p-type GaN layers 6-1 and 6-2 are electrically separated from each other.

Next, referring to step 311, protection layers 8-1 and 8-2 made of silicon dioxide or the like are formed by a sputtering/photolithography process to electrically protect the LED elements D1 and D2.

Next, referring to step 312, n-side electrodes 9-1 and 9-2 made of about 10 nm thick Ti and about 300 nm thick TiAl-TiPtAu are formed by an EB evaporation/photolithography process on the n-type GaN layers 4-1 and 4-2 in the opening of the protection layers 8-1 and 8-2.

Next, referring to step 313, connection layers 10-1 and 10-2 made of TiPtAu are formed by an EB evaporation/photolithography process on the n-type electrodes 9-1 and 9-2. In this case, the connection layer 10-1 is connected between the n-type electrode 9-1 of the LED element D1 and the bonding layer 7-2 of the LED element D2.

Next, referring to step 314, a power supply terminal (pad) T1 is formed in an opening of the insulating layer 3 in contact with the bonding layer 7-1. That is, the power supply terminal T1 is electrically connected to the p-type GaN layer 6-1 of the LED element D1 via the bonding layer 7-1.

The power supply terminal T1 is made of a metal such as Au, Cu, Ni, Ag, Pd, Al, Mg, In or Sn whose work function $\phi_m$ is smaller than the work function $\phi_s$ of silicon. That is, $\phi_s > \phi_m$. For example, the power supply terminal T1 is made of Al including 1% Si or 1% Cu on which TiPtAu for bonding Au wires thereon is formed. Thus, a Schottky barrier is established between the power supply terminal T1 and the p-type silicon layer 2 along with the pt-type monocrystalline silicon support substrate 1. That is, the power supply terminal T1 is in Schottky barrier contact with the p-type silicon layer 2 along with the $p^+$-type monocrystalline silicon support substrate 1. As a result, a Schottky diode element SBD is constructed by the power supply terminal T1 and the p-type silicon layer 2 along with the $p^+$-type monocrystalline silicon support substrate 1.

Finally, referring to step 315, a power supply terminal (pad) T2 is formed in an opening of the insulating layer 3 in contact with the connection layer 10-2. That is, the power supply terminal T2 is electrically connected to the n-type GaN layer 4-2 of the LED element D2 via the connection layer 10-2.

The power supply terminal T2 is made of a metal such as Pt or Ti which is in ohmic contact with the $p^+$-type monocrystalline silicon support substrate 1 along with the p-type silicon layer 2. Note that TiPtAu for bonding Al wires is formed on the metal such as Pt or Ti.

Thus, the LED elements D1 and D2 are connected in series between the power supply terminals T1 and T2.

In FIG. 2, the boron concentration of the p-type silicon layer 2 is adjusted, so as to sufficiently lower the forward rising voltage of the Schottky diode element SBD to be 0.3V to 0.9V and to raise the reverse breakdown voltage of the Schottky diode element SBD to be higher than 10V where the reverse current $I_r$ is 100 μA. On the other hand, the power supply terminal T2 is in ohmic contact with the p-type silicon layer 2 via the $p^+$-type monocrystalline silicon support substrate 1, and also, is connected to the connection layer 10-2. Therefore, a current, which should be supplied to the LED elements D1 and D2, is never leaked to the Schottky diode element SBD. In addition, the forward voltage drop of the LED elements D1 and D2 is not so large. Therefore, the power loss and generated heat of the LED elements D1 and D2 can be suppressed.

Figure 4:
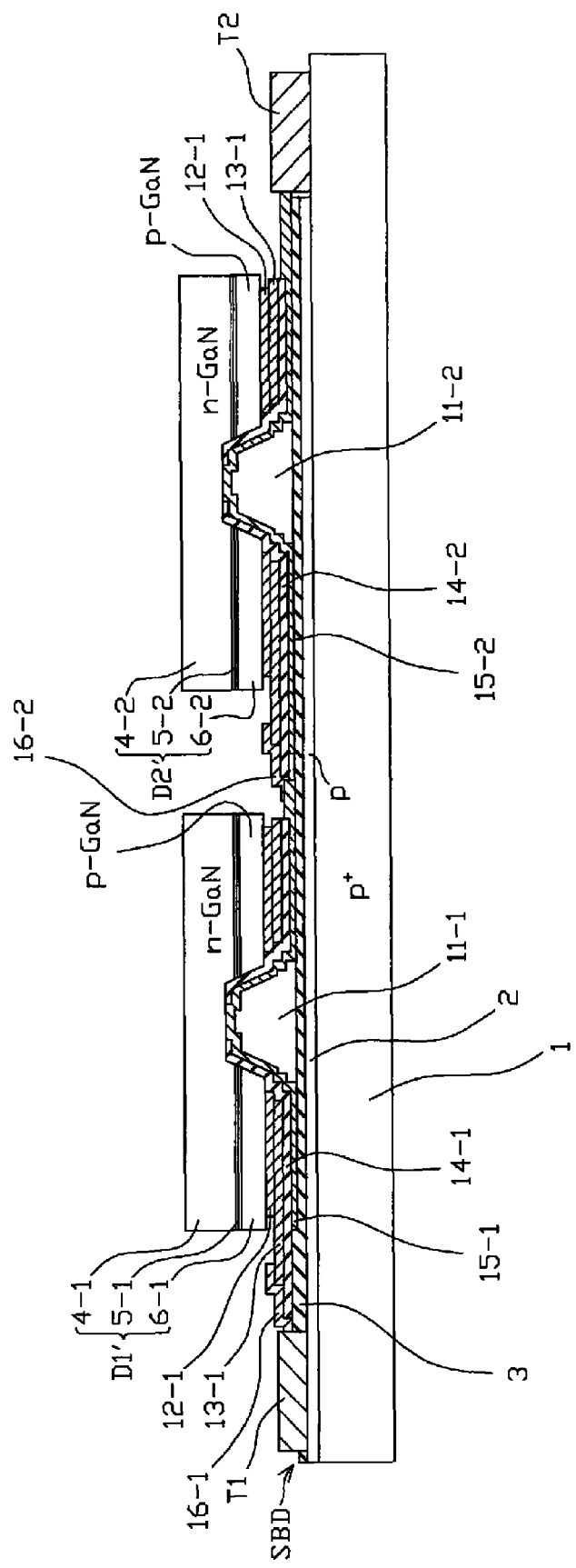
FIG. 4 is a cross-sectional view illustrating a second embodiment of the optical semiconductor device according to the presently disclosed subject matter.

In FIG. 4, which is a cross-sectional view illustrating a second embodiment of the optical semiconductor device according to the presently disclosed subject matter, the LED elements D1' and D2' of a via-type are arranged side by side.

In FIG. 4, a via hole 11-1 is formed in the n-type GaN layer 4-1, the active layer 5-1 and the p-type GaN layer 6-1 of FIG. 2. Also, provided on the side of the via hole 11-1 are p-side electrodes 12-1 and 13-1, an insulating layer 14-1 made of silicon dioxide or silicon nitride, and an n-side electrode (via electrode) 15-1.

Similarly, a via hole 11-2 is formed in the n-type GaN layer 4-2, the active layer 5-2 and the p-type GaN layer 6-2 of FIG. 2. Also, provided on the side of the via hole 11-2 are p-side electrodes 12-2 and 13-2, an insulating layer 14-2 made of silicon dioxide or silicon nitride, and an n-side electrode (via electrode) 15-2.

The LED elements D1' and D2' and the elements 12-1, 13-1, 14-1, 15-1, 12-2, 13-2, 14-2 and 15-2 are placed face down and bonded by a wafer pressure-bonding process onto the insulating layer 3 on the side of the $p^+$-type monocrystalline silicon support substrate 1.

Further, a connection layer 16-1 made of TiPtAl is formed so as to electrically connect the p-type GaN layer 6-1 of the LED element D1' to the power supply terminal T1. Also, a connection layer 16-2 made of TiPtAl is formed so as to electrically connect the n-type GaN layer 4-1 of the LED element D1' to the p-type GaN layer 6-2 of the LED element D2'.

The power supply terminals T1 and T2 are the same as those of FIG. 2.

Thus, the LED elements D1' and D2' are connected in series between the power supply terminals T1 and T2.

A method for manufacturing the optical semiconductor device of FIG. 4 is similar to that of the optical semiconductor device of FIG. 2 as illustrated in FIG. 3, except for the formation of the n-side electrodes 15-1 and 15-2.

Even in FIG. 4, the boron concentration of the p-type silicon layer 2 is adjusted, so as to sufficiently lower the forward rising voltage of the Schottky diode element SBD to be 0.3V to 0.9V and to raise the reverse breakdown voltage of the Schottky diode element SBD to be higher than 10V where the reverse current $I_r$ is 100 μA. On the other hand, the power supply terminal T2 is in ohmic contact with the p-type silicon layer 2 via the $p^+$-type monocrystalline silicon support substrate 1, and also, is connected to the n-side electrode 15-2. Therefore, a current, which should be supplied to the LED elements D1' and D2', is never leaked to the Schottky diode element SBD. In addition, the forward voltage drop of the LED elements D1' and D2' is not so large. Therefore, the power loss and generated heat of the LED elements D1' and D2' can be suppressed.

Figure 5:
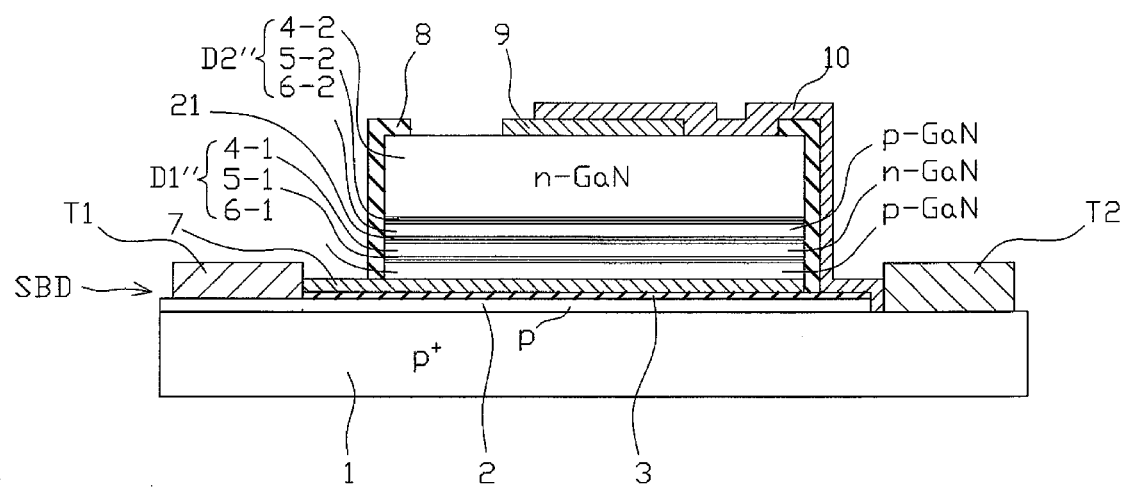
FIG. 5 is a cross-sectional view illustrating a third embodiment of the optical semiconductor device according to the presently disclosed subject matter.

In FIG. 5, which is a cross-sectional view illustrating a third embodiment of the optical semiconductor device according to the presently disclosed subject matter, the LED element D2" of a non-via-type are stacked onto the LED element D1" of a non-via-type.

In FIG. 5, the LED element D1" formed by the n-type GaN layer 4-1, the active layer 5-1 and the p-type GaN layer 6-1, and the LED element D2" formed by the n-type GaN layer 4-2, the active layer 5-2 and the p-type GaN layer 6-2 are stacked via a tunnel junction layer 21 which electrically connects the LED element D1" to the LED element D2". The tunnel junction layer 21 is formed by a pn junction, a pn junction having an intermediate undoped region, or a pn junction having an intermediate doped region from the pn junction.

The LED elements D1" and D2" are placed face down and bonded by a wafer pressure-bonding process onto the insulating layer 3 on the side of the p$^+$-type monocrystalline silicon support substrate 1.

In FIG. 5, since the LED element D2" is stacked on the LED element D1", the protection layers 8-1 and 8-2 of FIG. 2 is combined into a protection layer 8. Also, the connection layer 10-1 of FIG. 2 is unnecessary, and only a connection layer 10 corresponding to the connection layer 10-2 of FIG. 2 is present.

The power supply terminals T1 and T2 are the same as those of FIG. 2.

Thus, the LED elements D1" and D2" are connected in series between the power supply terminals T1 and T2.

Even in FIG. 5, the boron concentration of the p-type silicon layer 2 is adjusted, so as to sufficiently lower the forward rising voltage of the Schottky diode element SBD to be 0.3V to 0.9V and to raise the reverse breakdown voltage of the Schottky diode element SBD to be higher than 10V where the reverse current $I_r$ is 100 μA. On the other hand, due to the ohmic contact of the power supply terminal T2 connected to the p$^+$-type monocrystalline silicon support substrate 1 and the connection layer 10, the forward voltage drop of the LED elements D1" and D2" is not so large. Therefore, a current, which should be supplied to the LED elements D1" and D2", is never leaked to the Schottky diode element SBD. In addition, the forward voltage drop of the LED elements D1" and D2" is not so large. Therefore, the power loss and generated heat of the LED elements D1" and D2" can be suppressed.

Figure 6:
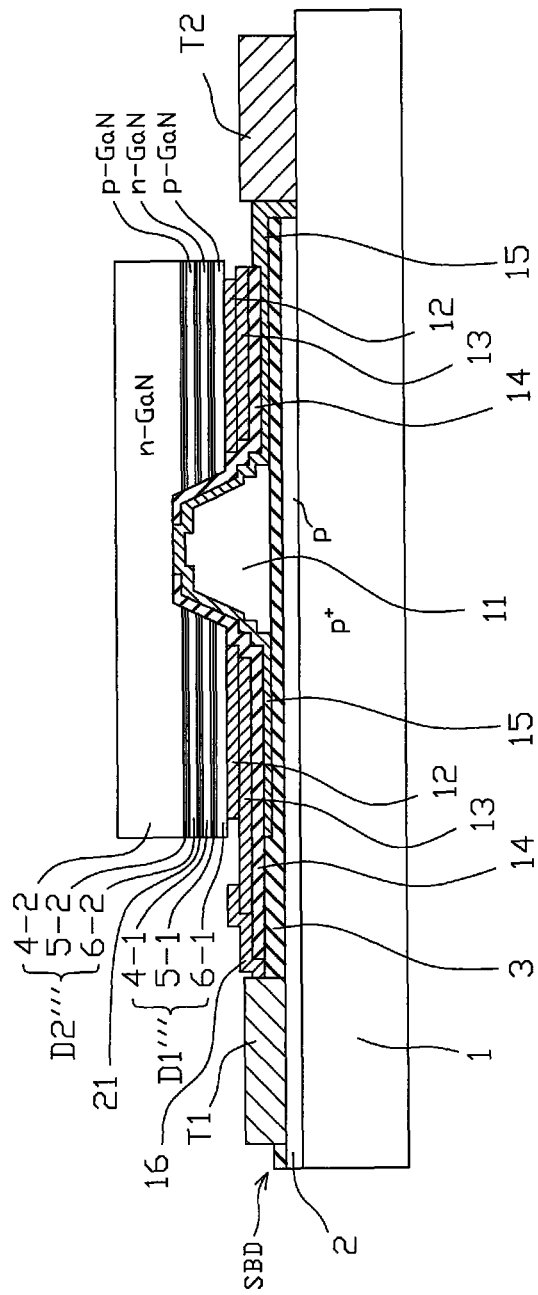
FIG. 6 is a cross-sectional view illustrating a fourth embodiment of the optical semiconductor device according to the presently disclosed subject matter.

In FIG. 6, which is a cross-sectional view illustrating a fourth embodiment of the optical semiconductor device according to the presently disclosed subject matter, the LED element D2''' of a via-type is stacked onto the LED element D1''' of a via-type.

In FIG. 6, a via hole 11 is formed in the n-type GaN layer 4-2, the active layer 5-2, the p-type GaN layer 6-2, the n-type GaN layer 4-1, the active layer 5-1 and the p-type GaN layer 6-1 of FIG. 5. Also, provided on the side of the via hole 11 are p-side electrodes 12 and 13, an insulating layer 14 made of silicon dioxide or silicon nitride, and an n-side electrode (via electrode) 15.

The LED elements D1''' and D2''' are placed face down and bonded by a wafer pressure-bonding process onto the insulating layer 3 on the side of the p$^+$-type monocrystalline silicon support substrate 1.

Further, a connection layer 16 made of TiPtAl is formed so as to electrically connect the p-type GaN layer 6-1 to the power supply terminal T1.

The power supply terminals T1 and T2 are the same as those of FIG. 2.

Thus, the LED elements D1''' and D2''' are connected in series between the power supply terminals T1 and T2.

Even in FIG. 6, the boron concentration of the p-type silicon layer 2 is adjusted, so as to sufficiently lower the forward rising voltage of the Schottky diode element SBD to be 0.3V to 0.9V and to raise the reverse breakdown voltage of the Schottky diode element SBD to be higher than 10V where the reverse current $I_r$ is 100 μA. On the other hand, the power supply terminal T2 is in ohmic contact with the p-type silicon layer 2 via the p$^+$-type monocrystalline silicon support substrate 1, and also, is connected to the n-side electrode 15-2. Therefore, a current, which should be supplied to the LED elements D1''' and D2''', is never leaked to the Schottky diode element SBD. In addition, the forward voltage drop of the LED elements D1''' and D2''' is not so large. Therefore, the power loss and generated heat of the LED elements D1''' and D2''' can be suppressed.

Figure 7:
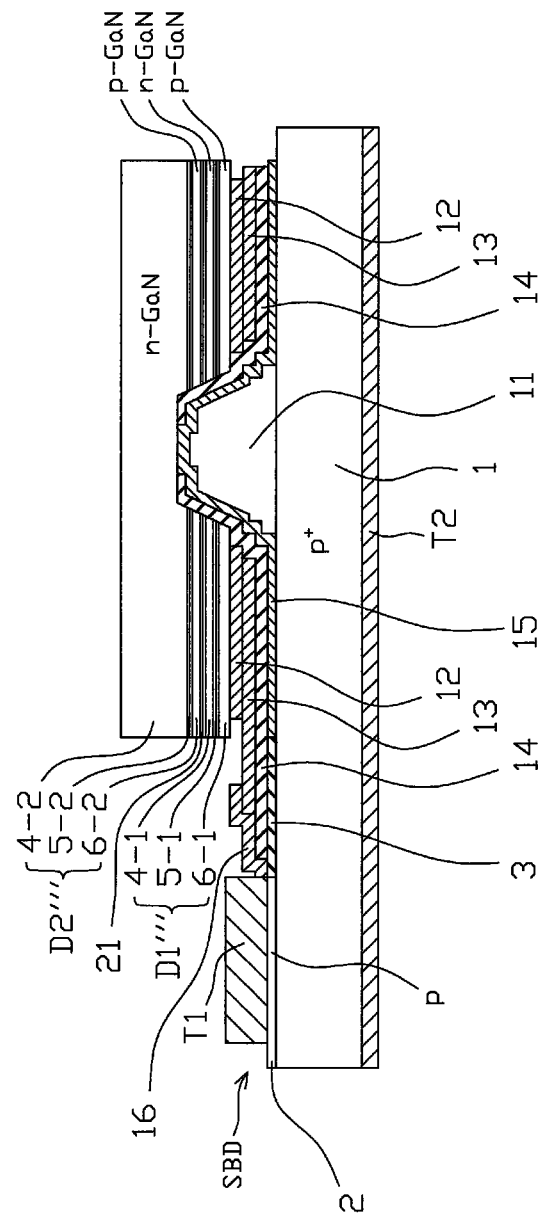
FIGS. 7 and 8 are cross-sectional views illustrating modifications of the optical semiconductor device of FIG. 6.

In FIG. 7, which is a modification of the optical semiconductor device of FIG. 6, the power supply terminal T2 is provided on a rear surface of the p$^+$-type monocrystalline silicon support substrate 1 of FIG. 6. Also, the n-side electrode 15 of FIG. 6 is connected via the p$^+$-type monocrystalline silicon support substrate 1 to the power supply terminal T2.

The LED elements D1''' and D2''' and the elements 12, 13, 14 and 15 are placed face down and bonded by a wafer pressure-bonding process onto the insulating layer 3 on the side of the p$^+$-type monocrystalline silicon support substrate 1.

The power supply terminal T1 is the same as that of FIG. 6.

The power supply terminal T2 is formed on the entire rear surface of the p$^+$-type monocrystalline silicon support substrate 1.

Thus, the LED elements D1''' and D2''' are connected in series between the power supply terminals T1 and T2.

Even in FIG. 7, the boron concentration of the p-type silicon layer 2 is adjusted, so as to sufficiently lower the forward rising voltage of the Schottky diode element SBD to be 0.3V to 0.9V and to raise the reverse breakdown voltage of the Schottky diode element SBD to be higher than 10V where the reverse current $I_r$ is 100 μA. On the other hand, the power supply terminal T2 is in ohmic contact with the p-type silicon layer 2 via the p$^+$-type monocrystalline silicon support substrate 1, and also, is connected via the p$^+$-type monocrystalline silicon support substrate 1 to the n-side electrode 15. Therefore, a current, which should be supplied to the LED elements D1''' and D2''', is never leaked to the Schottky diode element SBD. In addition, the forward voltage drop of the LED elements D1''' and D2''' is not so large. Therefore, the power loss and generated heat of the LED elements D1''' and D2''' can be suppressed.

The modification of FIG. 7 can be applied to the optical semiconductor devices of FIGS. 2, 4 and 5. That is, the power supply terminal T2 can be provided on the rear surface of the p$^+$-type monocrystalline silicon support substrate 1.

Figure 8:
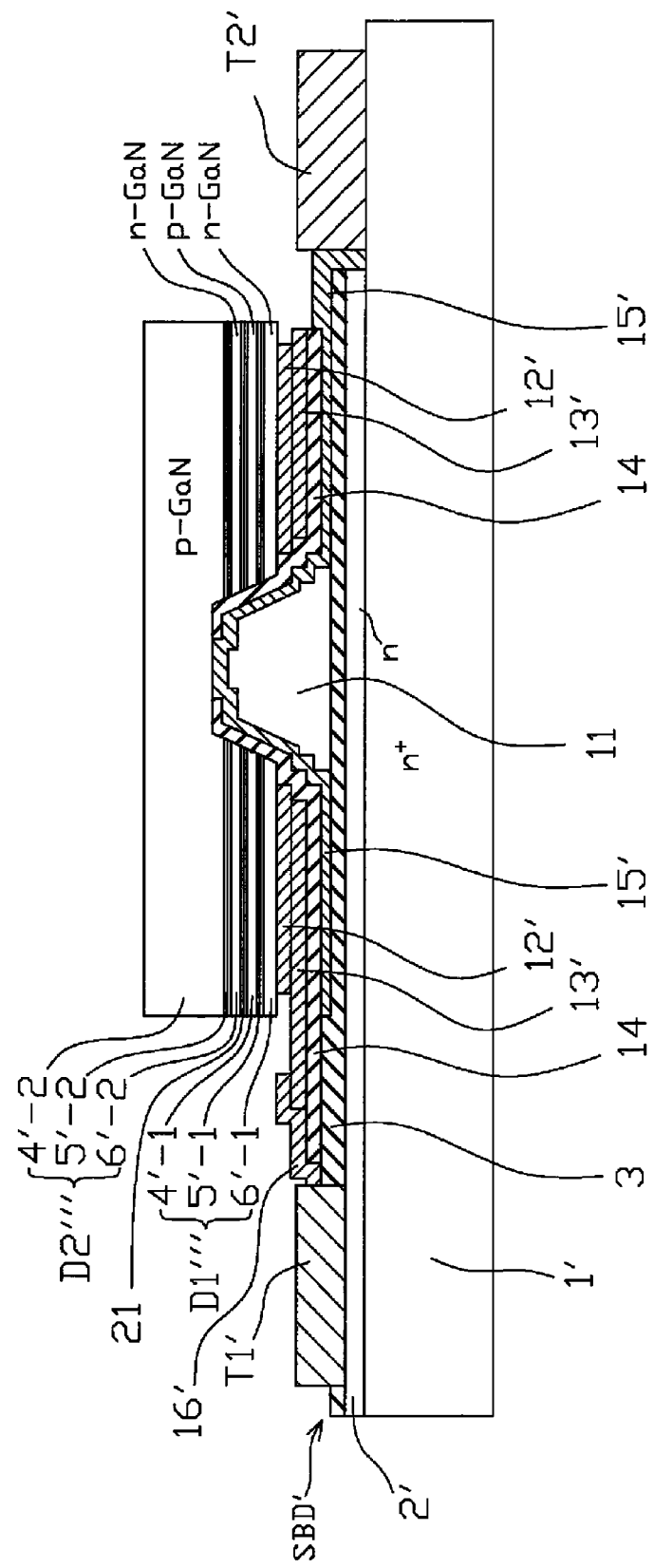

In FIG. 8, which is also a modification of the optical semiconductor device of FIG. 6, the p$^+$-type monocrystalline silicon support substrate 1 and the p-type silicon layer 2 of FIG. 6 are replaced by an n$^+$-type monocrystalline silicon support substrate 1' and an n-type silicon layer 2', respectively. Also, the LED element D''' is formed by a p-type GaN layer 4'-1, an InGaN/GaN MQW active layer 5'-1 and a p-type GaN layer 6'-1, and the LED element D2'' is formed by a p-type GaN layer 4'-2, an InGaN/GaN MQW active layer 5'-2 and a p-type GaN layer 6'-2.

The power supply terminal T1 of FIG. 6 is replaced by a ground potential power supply terminal T1' which is made of a metal such as Mg, Mo, Ni, Sb, W, Al, Ag, Cu, Pd, Au or Pt whose work function $\phi_m$ is larger than the work function $\phi_s$ of silicon. That is, $\phi_s < \phi_m$.

A Schottky diode element SBD' is constructed by the power supply terminal T1' and the n-type silicon layer 2' along with the n$^+$-type monocrystalline silicon support substrate 1'.

A positive potential power supply terminal T2' is the same as the power supply terminal T2 of FIG. 6.

The LED elements D1''' and D2''' and the elements 12', 13', 14' and 15' are placed face down and bonded by a wafer pressure-bonding process onto the insulating layer 3 on the side of the n⁺-type monocrystalline silicon support substrate 1'.

Also, the p-side electrodes 12 and 13 and the n-side electrode 15 of FIG. 6 are replaced by n-side electrodes 12' and 13', and a p-side electrode 15', respectively.

Thus, the LED elements D1''' and D2''' are connected between the power supply terminals T1' and T2'.

Even in FIG. 8, the arsenic (or phosphorus) concentration of the n-type silicon layer 2' is adjusted, so as to sufficiently lower the forward rising voltage of the Schottky diode element SBD' to be 0.3V to 0.9V and to raise the reverse breakdown voltage of the Schottky diode element SBD' to be higher than 10V where the reverse current $I_r$ is 100 μA. On the other hand, the power supply terminal T2' is in ohmic contact with the n-type silicon layer 2' via the n⁺-type monocrystalline silicon support substrate 1', and also, is connected to the p-side electrode 15'. Therefore, a current, which should be supplied to the LED elements D1''' and D2''', is never leaked to the Schottky diode element SBD'. In addition, the forward voltage drop of the LED elements D1''' and D2''' is not so large. Therefore, the power loss and generated heat of the LED elements D1''' and D2''' can be suppressed.

Figure 9:
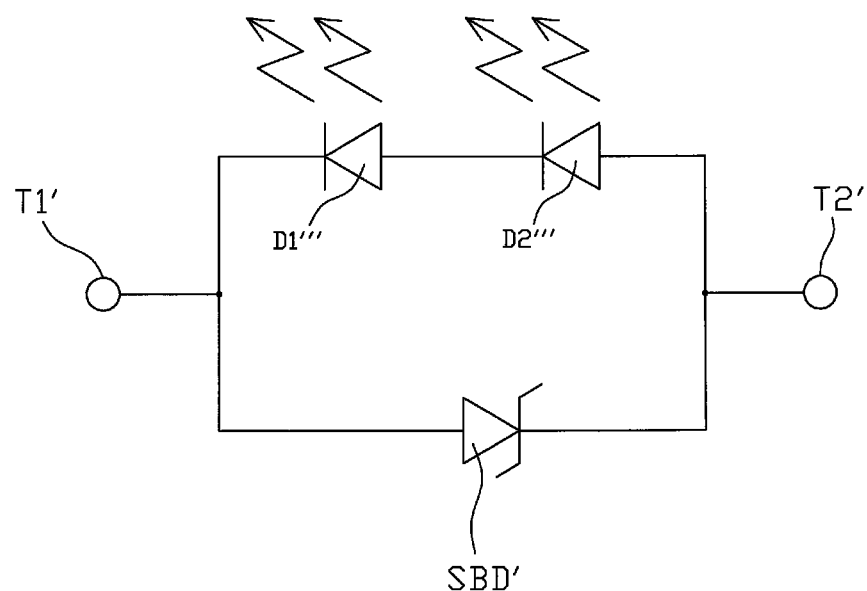
FIG. 9 is an equivalent circuit diagram of the optical semiconductor device of FIG. 8.

An equivalent circuit diagram of the optical semiconductor device of FIG. 8 is illustrated in FIG. 9.

The modification of FIG. 8 can be applied to the optical semiconductor devices of FIGS. 2, 4 and 5.

In the above-described embodiments, the p⁺-type monocrystalline silicon support substrate 1, the p-type silicon layer 2, the n⁺-type monocrystalline silicon support substrate 1' and the n-type silicon layer 2' can be made of Ge, GaAs or the like, other than Si.

Also, in the above-described embodiments, the LED elements D1 (D1', D1'', D1''') and D2 (D2', D2'', D2''') can be made of three-element or four-element mixed crystal such as InAlGaAl, InGaAlP or InGaAlN.

Further, in the above-described embodiments, the number of LED elements can be one, three or more.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. An optical semiconductor device comprising:
    a semiconductor support substrate of a conductivity type, the semiconductor support substrate having a first resistivity;
    a semiconductor layer of said conductivity type, the semiconductor layer being formed on said semiconductor support substrate and having a second resistivity higher than said first resistivity;
    a first power supply terminal having a first metal in Schottky barrier contact with said semiconductor layer along with said semiconductor support substrate, so that a Schottky diode element is constructed by said first power supply terminal and said semiconductor layer along with said semiconductor support substrate;
    a second power supply terminal having a second metal in ohmic contact with said semiconductor support substrate; and
    a semiconductor light-emitting element connected between said first and second power supply terminals,
    wherein said semiconductor light-emitting element is anti-parallel with said Schottky diode with respect to said first and second power supply terminals.

2. The optical semiconductor device as set forth in claim 1, further comprising an insulating layer formed on said semiconductor layer,
    wherein said semiconductor light-emitting element is provided on said insulating layer, and
    wherein said second power supply terminal is provided on a first surface of said semiconductor support substrate on a same side of said semiconductor support substrate as said semiconductor light-emitting element.

3. The optical semiconductor device as set forth in claim 1, further comprising an insulating layer formed on said semiconductor layer,
    wherein said semiconductor light-emitting element is provided on said insulating layer, and
    wherein said second power supply terminal is provided on a surface of said semiconductor support substrate on an opposite side of said semiconductor support substrate from said semiconductor light-emitting element.

4. The optical semiconductor device as set forth in claim 1, wherein said semiconductor light-emitting element comprises a plurality of serially-connected light-emitting diode elements.

5. The optical semiconductor device as set forth in claim 4, wherein said plurality of light-emitting diode elements are arranged side by side.

6. The optical semiconductor device as set forth in claim 5, wherein one via hole is formed in each of said light-emitting diode elements.

7. The optical semiconductor device as set forth in claim 4, wherein said plurality of light-emitting diode elements are stacked on each other.

8. The optical semiconductor device as set forth in claim 7, wherein one via hole is formed in said plurality of light-emitting diode elements.

* * * * *